(12) United States Patent
Hasegawa

(10) Patent No.: US 11,887,963 B2
(45) Date of Patent: Jan. 30, 2024

(54) SEMICONDUCTOR DEVICE

(71) Applicant: KIOXIA CORPORATION, Tokyo (JP)

(72) Inventor: Kazuma Hasegawa, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 153 days.

(21) Appl. No.: 17/187,686

(22) Filed: Feb. 26, 2021

(65) Prior Publication Data
US 2022/0052015 A1  Feb. 17, 2022

(30) Foreign Application Priority Data

Aug. 17, 2020 (JP) .................................. 2020-137632

(51) Int. Cl.
*H01L 23/00* (2006.01)
*H01L 25/18* (2023.01)

(52) U.S. Cl.
CPC .............. *H01L 24/49* (2013.01); *H01L 24/13* (2013.01); *H01L 24/20* (2013.01); *H01L 24/45* (2013.01);
(Continued)

(58) Field of Classification Search
CPC ......... H01L 24/49; H01L 24/13; H01L 24/20; H01L 24/45; H01L 25/18; H01L 2224/13147; H01L 2224/211; H01L 2224/4502; H01L 2224/46; H01L 2924/1431; H01L 24/29; H01L 24/32; H01L 24/48; H01L 24/83; H01L 24/11; H01L 24/16; H01L 24/73; H01L 24/92; H01L 24/85; H01L 2224/214; H01L 2224/0401; H01L 2224/1134; H01L 2224/13082; H01L 2224/13144; H01L 2224/2919; H01L 2224/45099; H01L 2224/45144; H01L 2224/48091; H01L 2224/48145; H01L 2224/48147; H01L 2224/48227; H01L 2224/49175; H01L 2224/73207; H01L 2224/73265;
(Continued)

(56) References Cited

U.S. PATENT DOCUMENTS 8,404,520 B1  3/2013 Chau et al.
9,153,549 B2  10/2015 Oyamada et al.
(Continued)

FOREIGN PATENT DOCUMENTS

JP  5546315 B2  7/2014
JP  6297553 B2  3/2018
(Continued)

*Primary Examiner* — Jasmine J Clark
(74) *Attorney, Agent, or Firm* — Kim & Stewart LLP

(57) ABSTRACT

According to one embodiment, a semiconductor device includes a support and a stacked body on the support. The stacked body is formed of a plurality of semiconductor chips that are stacked on each other. The stacked body has a lower surface facing the support and an upper surface facing away from the support. A first wire is connected to one of the semiconductor chips in the stack and extends upward from the semiconductor chip to at least the height of the upper surface of the stacked body. A second wire is connected to the support and extends upward from the support to at least the height of the upper surface of the stacked body.

20 Claims, 12 Drawing Sheets

(52) U.S. Cl.
CPC .... *H01L 25/18* (2013.01); *H01L 2224/13147* (2013.01); *H01L 2224/211* (2013.01); *H01L 2224/214* (2013.01); *H01L 2224/4502* (2013.01); *H01L 2224/46* (2013.01); *H01L 2924/1431* (2013.01); *H01L 2924/1438* (2013.01)

(58) Field of Classification Search
CPC ....... H01L 25/0657; H01L 2225/06506; H01L 2225/0651; H01L 2225/06548; H01L 2225/06562; H01L 2225/06586; H01L 23/49811; H01L 23/552; H01L 23/49; H01L 23/50; H01L 23/52; H01L 2924/181; H10B 80/00
USPC .................................................. 257/777, 784
See application file for complete search history.

(56) References Cited

U.S. PATENT DOCUMENTS

| | | |
|---|---|---|
| 9,502,371 B2 | 11/2016 | Colosimo, Jr. et al. |
| 2013/0224914 A1 | 8/2013 | Co et al. |
| 2016/0035695 A1* | 2/2016 | Kumamoto ............. H01L 25/50 |
| | | 438/109 |
| 2018/0240773 A1 | 8/2018 | Delacruz et al. |

FOREIGN PATENT DOCUMENTS

| | | |
|---|---|---|
| TW | 201347059 A | 11/2013 |
| WO | 2013172060 A1 | 11/2013 |

\* cited by examiner

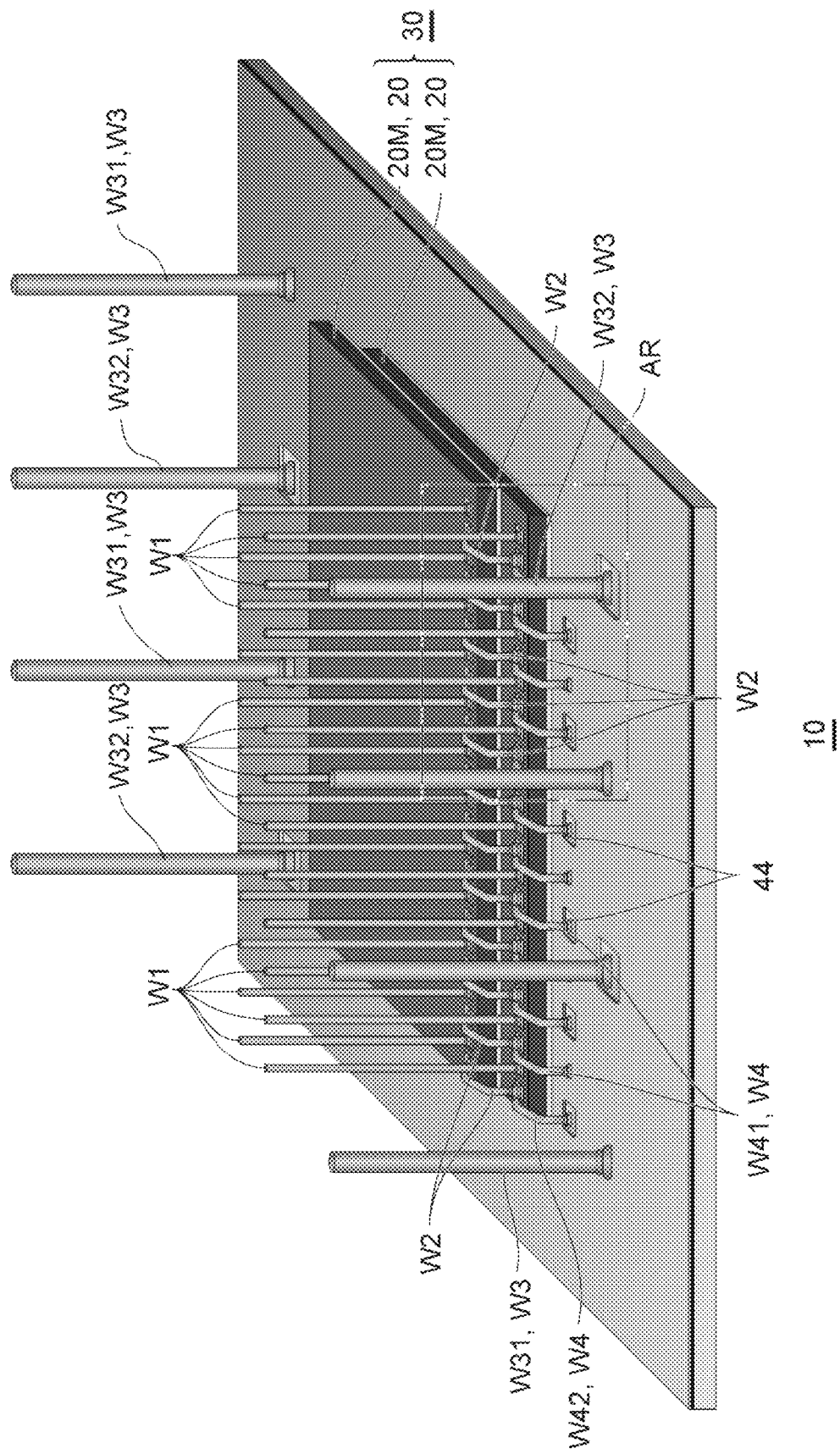

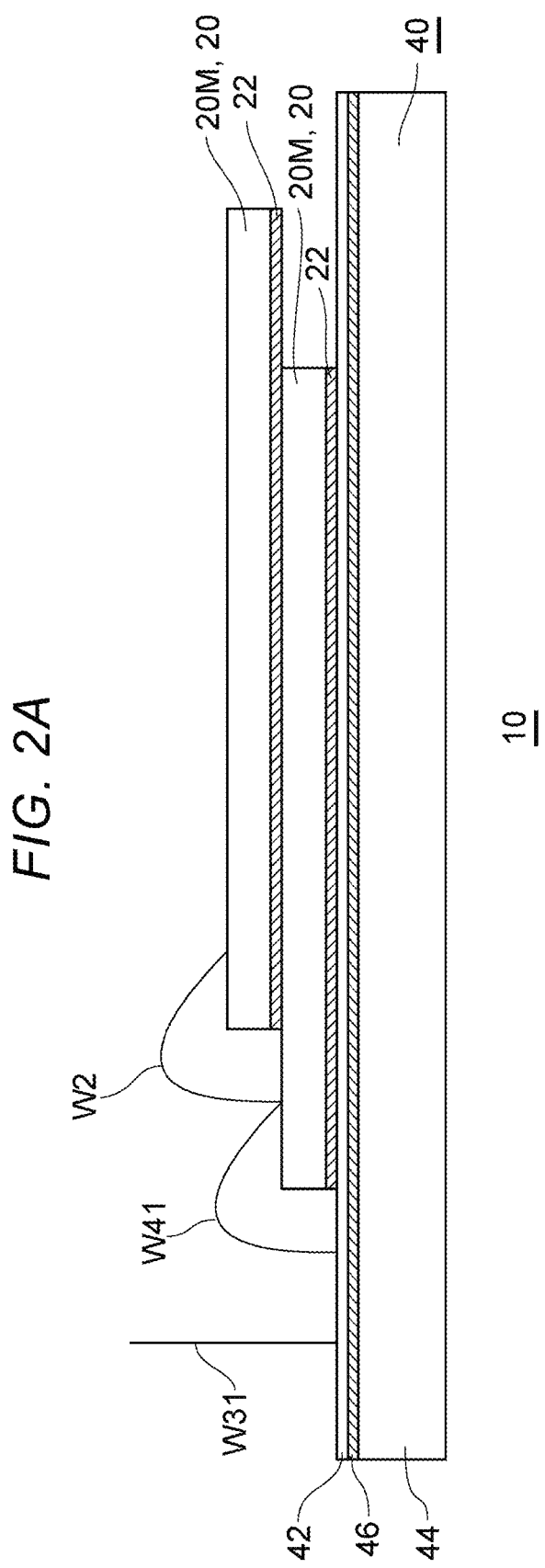

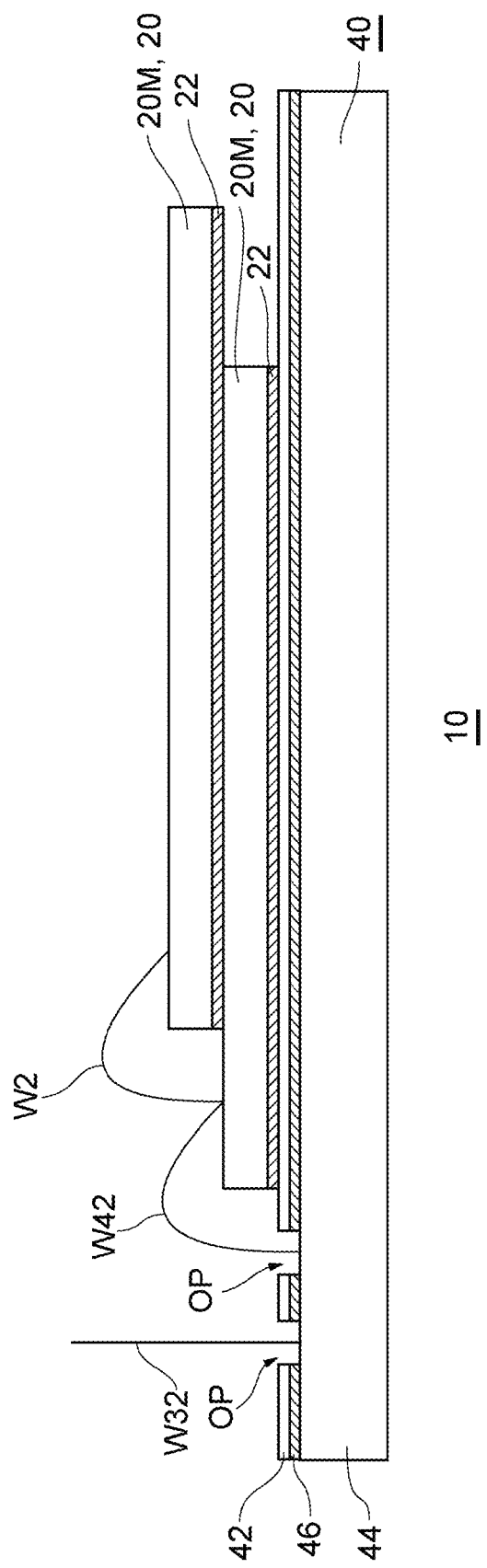

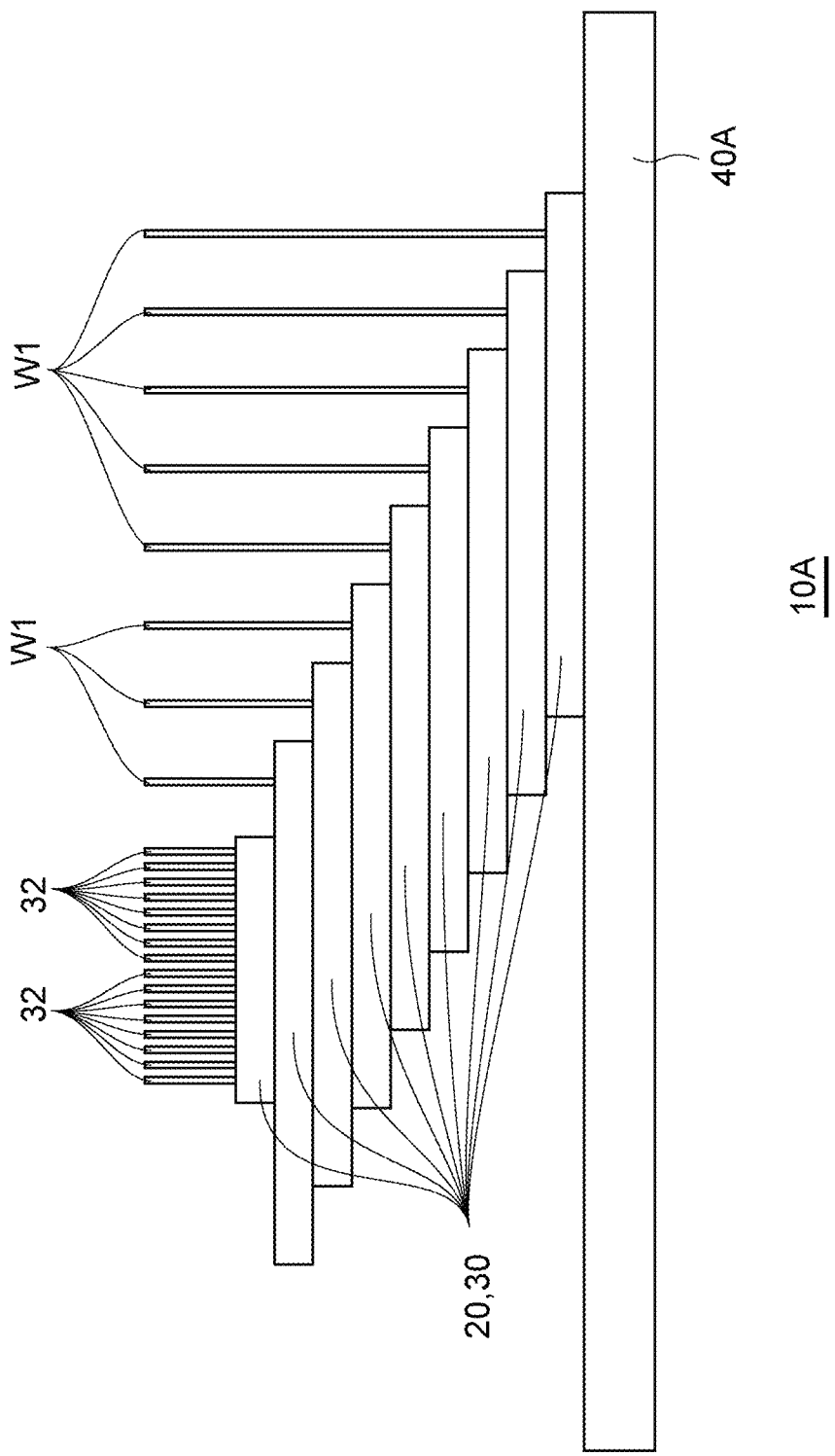

SEMICONDUCTOR DEVICE

CROSS-REFERENCE TO RELATED APPLICATION

This application is based upon and claims the benefit of priority from Japanese Patent Application No. 2020-137632, filed Aug. 17, 2020, the entire contents of which are incorporated herein by reference.

FIELD

Embodiments described herein relate generally to a semiconductor device.

BACKGROUND

A semiconductor device formed of stacked semiconductor chips is known. Information can be exchanged between such chips via bonding wires. However, as the number of stacked semiconductor chips is increased, the stacked body becomes thicker, and the wires connecting some chips in the stack are required to become longer and possibly more densely packed. Since a bonding capillary of a wire bonder usually has a conical tip shape, there may be a problem that the capillary interferes with or contacts other wires during bonding.

BRIEF DESCRIPTION OF THE DRAWINGS

FIG. 1A is a perspective view schematically illustrating a semiconductor device according to a first embodiment.

FIG. 2A is a cross-sectional view schematically illustrating a cross section of a semiconductor device according to a first embodiment.

FIG. 2B is a cross-sectional view schematically illustrating a cross section of a semiconductor device according to a first embodiment.

FIG. 4 is a side view schematically illustrating a semiconductor device according to a second embodiment.

DETAILED DESCRIPTION

Figure 1B:
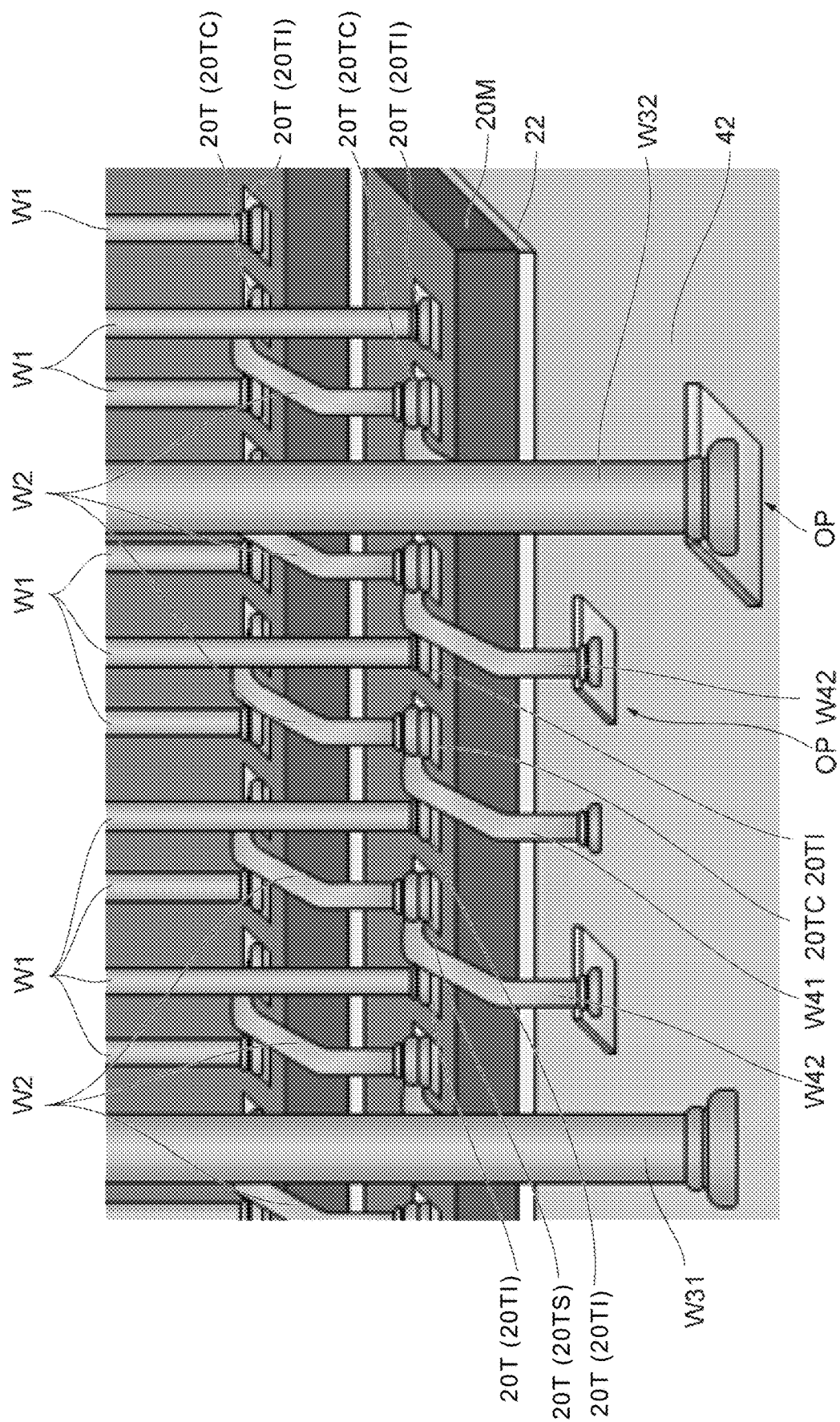
FIG. 1B is an enlarged view of a region AR in FIG. 1A.

Embodiments provide a semiconductor device which can avoid problems associated with a bonding capillary that can interfere with other closely positioned wires during fabrication steps.

In general, according to one embodiment, a semiconductor device includes a support and a stacked body on the support. The stacked body includes a plurality of semiconductor chips stacked on each other and has a lower surface facing the support and an upper surface facing away from the support. A first wire is connected to one of the semiconductor chips and extends upward from the semiconductor chip to at least the height of the upper surface of the stacked body. A second wire is connected to the support and extends upward from the support to at least the height of the upper surface of the stacked body.

The certain example embodiments will be described with reference to the accompanying drawings. In general, in the drawings, repeated elements or aspects are designated by the same reference numerals in each drawing when applicable, and description of such repeated element or aspects can be omitted from subsequent embodiments after introduction.

FIG. 1A is a perspective view schematically illustrating part of a semiconductor device 10 according to a first embodiment. FIG. 1B is an enlarged view of a region AR illustrated in FIG. 1A. FIG. 2A is a cross-sectional view schematically illustrating a cross section of the semiconductor device 10. FIG. 2B is a schematic cross-sectional view of the semiconductor device 10 in a cross section passing through an opening OP formed in a first electrode layer 42 of a support 40.

The semiconductor device 10 includes a plurality of stacked semiconductor chips 20 (the plurality of stacked semiconductor chips 20 may be referred to collectively as a "stacked body" or more particularly a stacked body 30). FIGS. 1A to 2B illustrate a state in which only two semiconductor chips 20 are stacked so as to make description easy to understand, the present disclosure is not limited to stacks of only two chips. The semiconductor device 10 includes a plurality of first wires W1. Each first wire W1 has one (a lower) end connected to one of the semiconductor chips 20 and extends to at least a height of an upper surface of stacked body 30 (formed by the plurality of chips 20). The semiconductor device 10 also includes plurality of second wires W2 that connect the two semiconductor chips 20 to each other. The upper end of each of the first wires W1 is connected to a redistribution layer 50 (see FIG. 3J) disposed on the stacked body 30. In the present disclosure, terms indicating directions such as upward (an upward direction on a paper surface in FIG. 2A and the like), downward (a downward direction on the same paper surface), and a horizontal direction (a lateral direction or a vertical direction on the same paper surface) are used to indicate relative positional relationships for the sake of convenience.

The semiconductor device 10 according to the first embodiment includes the support 40 (e.g., a substrate) that supports the stacked body 30 and a plurality of third wires W3. Each third wire W3 has one end (a lower end) connected to the support 40 and extends in a direction substantially perpendicular to a surface of the support 40. The other end (an upper end) of the third wires W3 is connected to the redistribution layer 50. A plurality of fourth wires W4 connect the support 40 to the semiconductor chips 20.

Each of the semiconductor chips 20 is formed of, for example, a silicon substrate in a rectangular plate shape having respective sides of several millimeters. A plurality of electrodes 20T are provided on an upper surface of the semiconductor chip 20. Each electrode 20T is an external connection pad (terminal) used for electrically connecting the semiconductor chip 20 to an external device via an opening formed in a passivation film covering the upper surface of the semiconductor chip 20. As illustrated in FIG. 1A, the plurality of electrodes 20T are arranged in a row at an end portion of the semiconductor chips 20 that is not covered by the other semiconductor chips 20 stacked above.

The semiconductor chip 20 is, for example, a three-dimensional stacked NAND flash memory chip or another type of semiconductor memory chip. The semiconductor chip 20 of this example includes a memory cell array provided in three dimensions (also referred to as a stacked memory cell array) can be referred to as a semiconductor memory chip 20M. Each semiconductor memory chip 20M also includes peripheral circuits, such as an I/O interface circuit, a control circuit, a voltage generation circuit, a sense amplifier, a column decoder, a data latch, and a row decoder.

The semiconductor memory chips 20M include a VCCQ terminal 20TC for supplying a substantially constant potential to an I/O interface circuit or the like, a VSS terminal 20TS for supplying a ground potential, and I/O terminals 20TI for inputting and outputting data. A plurality of other control terminals for supplying a control signal (s) such as a command latch enable signal are similarly provided as one or more of the electrodes 20T. At least some of the I/O terminals 20TI are between the VSS terminal 20TS and the VCCQ terminal 20TC.

The semiconductor memory chips 20M are stacked to form the stacked body 30. The semiconductor memory chips 20M is offset in a predetermined direction with respect to the semiconductor memory chip 20M immediately below. This offset stacking performed in stepwise manner leaves the electrodes 20T formed in a row near the edge of an upper surface of each semiconductor memory chip 20M exposed. The semiconductor memory chips 20M are adhered to each other by, for example, a die attach film 22 formed of a material such as an acrylic polymer and/or an epoxy resin. The semiconductor memory chips 20M may be adhered to each other by using an adhesive other than a die attach film 22.

Further, a controller chip (FIG. 3D) 20C for controlling semiconductor memory chips 20M can be stacked on the uppermost semiconductor memory chip 20M. The controller chip 20C may also be referred to as an interface chip. The controller chip 20C receives a command from an external device such as a host device to which the semiconductor device 10 is connected, and accordingly, causes the semiconductor memory chip 20M to read or write data. A plurality of electrodes are formed on an upper surface of the controller chip 20C and can be arranged as an array in two dimensions.

Figure 3A:
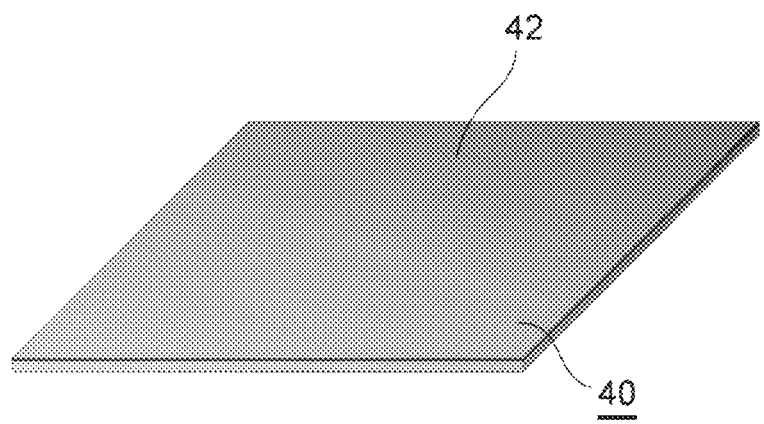
FIGS. 3A to 3J are perspective views illustrating aspects of a manufacturing process of a semiconductor device according to a first embodiment.
Figure 3B:
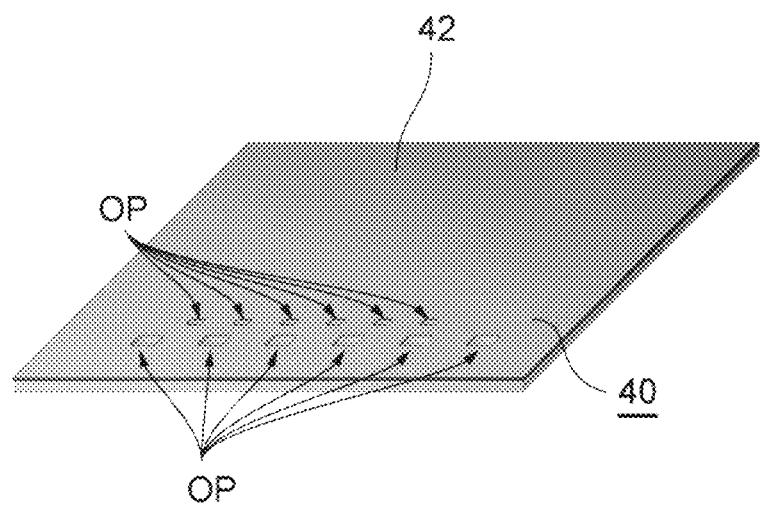
Figure 3C:
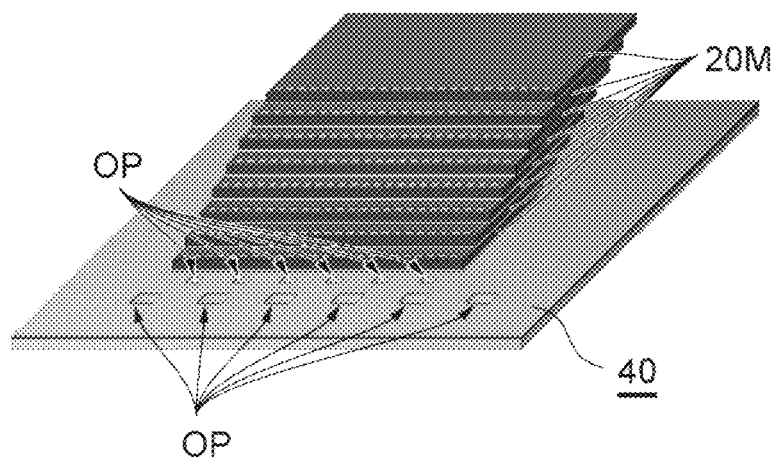
Figure 3D:
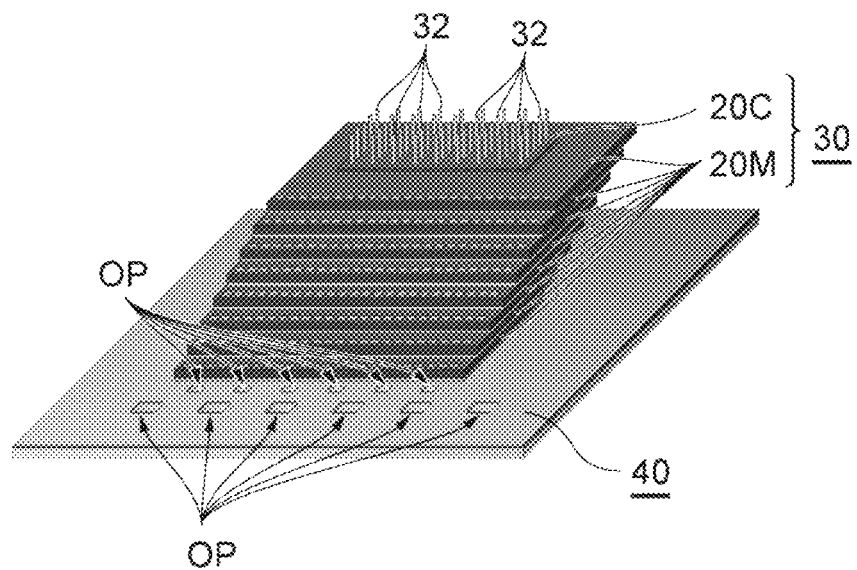
Figure 3E:
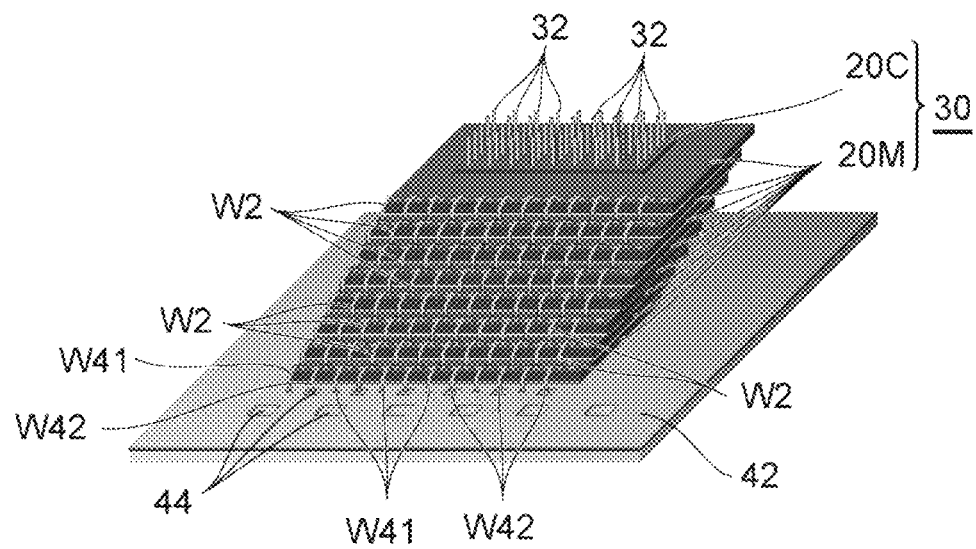
Figure 3F:
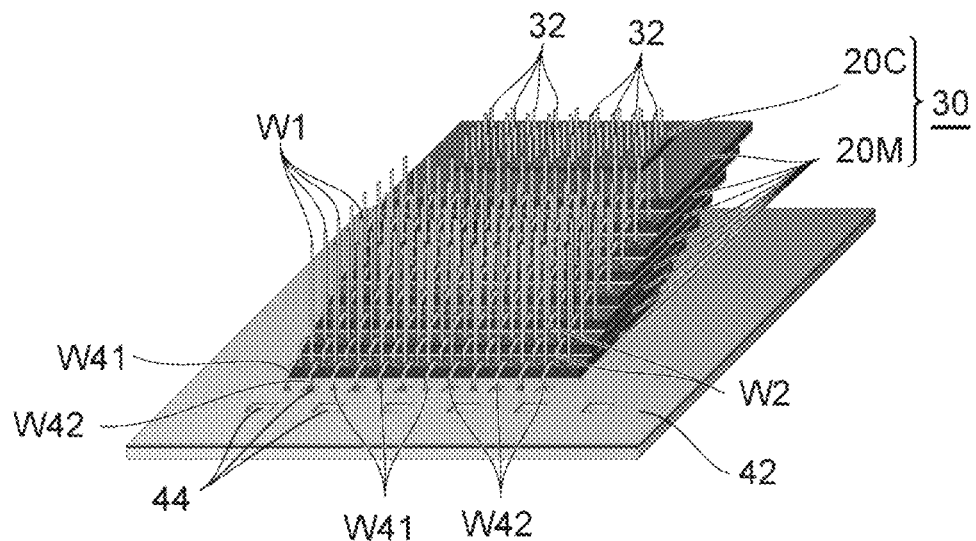
Figure 3G:
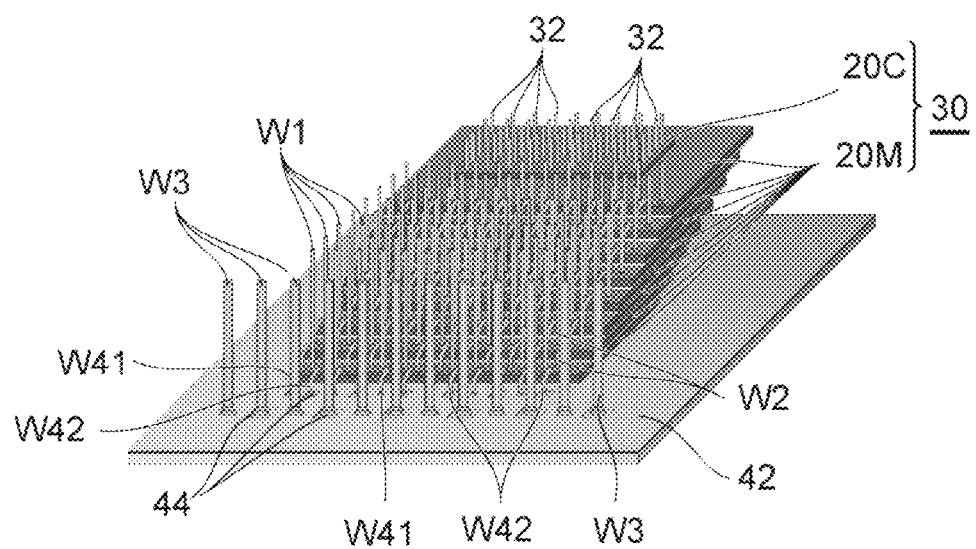

For example, as illustrated in FIG. 3G, the stacked body 30 is configured with eight semiconductor memory chips 20M and one controller chip 20C stacked on the uppermost semiconductor memory chip 20M.

Terminals 32 (FIG. 3D) formed of copper pillars formed in a columnar shape protruding upward from an upper surface of the controller chip 20C (which corresponds in this context to an upper surface of the stacked body 30) are provided on the plurality of electrodes provided on the upper surface of the controller chip 20C. The controller chip 20C transmits and receives signals via the terminals 32. The copper pillars may be used or, alternatively, wires may be used depending on a chip size, the number of pads, and the number of electrodes. Further, the terminals 32 are shorter in the vertical direction than the first wires W1 connected to electrodes of the semiconductor memory chip 20M. For example, a height of each of the copper pillar terminals 32 is 10 μm to 300 μm.

The support 40 is a substrate that supports the semiconductor chip 20 when the stacked body 30 is being formed. As illustrated in FIG. 2A, the support 40 has a three-layer structure including, a second electrode layer 44, an insulating layer 46 that is provided on the second electrode layer 44 and functions as a dielectric, and a first electrode layer 42 provided on the insulating layer 46. The portion of the support 40 including the first electrode layer 42 and the second electrode layer 44 with the insulating layer 46 therebetween functions as a capacitor. The first electrode layer 42 and the second electrode layer 44 may be formed over the entire surface of the support 40 or may be formed on just a part thereof. For example, in top view, it is preferable that a region where the stacked body 30 is provided and a region where the first electrode layer 42 and the second electrode layer 44 are formed overlap each other in at least a part. Further, a plurality of openings OP are formed in the first electrode layer 42, and the second electrode layer 44 is exposed at the bottom of the openings OP.

The first wire W1 electrically connects the semiconductor memory chip 20M to the redistribution layer 50 (FIG. 3J) disposed above the stacked body 30. Each first wire W1 stands erect substantially perpendicular to a surface of the semiconductor memory chip 20M, is connected to an electrode 20T of the semiconductor memory chip 20M at a lower end, and is connected at an upper end to the redistribution layer 50. The upper end of the first wire W1 may be electrically connected to the first external electrode, which is one of the bump electrodes 70 (FIG. 3J) provided on the redistribution layer 50.

For example, the angle formed by a straight line connecting a lower end to an upper end of a first wire W1 and a line normal to the surface of the semiconductor memory chip 20M to which the first wire W1 is connected is 20 degrees or less. The first wire W1 is formed of a conductive metal such as gold. The first external electrode may be used for exchanging input/output signals.

The second wires W2 electrically connect the electrodes of the adjacent semiconductor memory chips 20M to each other. Since the two electrodes 20T to which the second wires W2 are connected face the same direction (upward), the second wires W2 are formed in a partial loop shape. That is, each second wire initially extends upward then curves around to extend downward, as illustrated in FIG. 2A.

The third wires W3 electrically connect the electrodes of the support 40 to the redistribution layer 50. The third wires W3 stand erect in a direction substantially perpendicular to a surface of the support. As illustrated in FIG. 1A and so on, the third wires W31, which are one part of the plurality of third wires W3, are connected at a lower end to the first electrode layer 42, which is an electrode of the support 40 and are connected at an upper end to the redistribution layer 50. The third wires W31 supply a voltage corresponding to VCCQ to the first electrode layer 42 from the second external electrode, which is one of the bump electrodes 70 (FIG. 3J) provided on the redistribution layer 50.

Third wires W32, which are another part of the plurality of third wires W3, are connected at a lower end to the second electrode layer 44 which is an electrode of the support 40 and are connected at an upper end to the redistribution layer 50. The third wires W32 supply a ground potential corresponding to VSS to the second electrode layer 44 from the third external electrode, which is one of the bump electrodes 70 provided on the redistribution layer 50. The third wires W3 are formed of a conductive metal and have a diameter greater than the first wires W1.

The fourth wires W4 electrically connect the electrodes of the support 40 to electrodes 20T of the semiconductor memory chips 20M. A fourth wire W41 of the plurality of fourth wires W4 has one end connected to the first electrode layer 42 and has the other end connected to the VCCQ terminal 20TC of a semiconductor memory chip 20M.

A fourth wire W42 of the plurality of fourth wires W, has one end connected to the second electrode layer 44 and has the other end connected to a VSS terminal 20TS of a semiconductor memory chip 20M. Since the two electrodes to which the fourth wires W4 are connected face the same direction (upward), the fourth wires W4 are provided in a partial loop shape as illustrated in FIG. 2B.

As illustrated in FIG. 1B, in the semiconductor device 10 according to the present embodiment, the second wires W2 (which are provided in a partial loop shape) are provided between adjacent ones of the first wires W1 connected to the same semiconductor memory chip 20M. That is, among the electrodes 20T provided on the same semiconductor memory chip 20M, the second wires W2 are connected to an electrode 20T this between the two other electrodes 20T to which a pair of adjacent first wires W1 are connected. Likewise, the fourth wires W4 having a partial loop shape are connected to an electrode 20T provided between electrodes 20T connected to a pair of adjacent first wires W1. That is, among the electrodes 20T on the same semiconductor memory chip 20M, the electrode 20T to which a fourth wire W4 is connected is between two electrodes 20T to which a pair of adjacent first wires W1 are respectively connected. For example, the two adjacent first wires W1 are respectively connected to two I/O terminals 20TI of a semiconductor memory chip 20M. The VCCQ terminal 20TC to which the fourth wire W4 is connected is between a pair of I/O terminals 20TI. The other end of the fourth wire W4 is connected to the first electrode layer 42.

The second wires W2 are connected to a VCCQ terminal 20TC on one semiconductor memory chip 20M and another e VCCQ terminal 20TC on a semiconductor memory chip 20M on one upper layer in the chip stack. With this configuration, power is supplied to the support 40 via the third wires W3. Power can be supplied to the VCCQ terminal 20TC of each semiconductor memory chip 20M by the plurality of second wires W2 connected between the fourth wire W4 connected to the support 40 and the semiconductor memory chip 20M. Since the support 40 functions as a capacitance and is provided in the vicinity of the semiconductor memory chip 20M, even when a high frequency signal is transmitted and received via the I/O terminals 20TI, it is possible to reduce influence of power supply noise that can be generated at the VCCQ terminal 20TC due to this. In addition, since the I/O terminal 20TI is connected to the redistribution layer 50 by the first wire W1, it is possible to increase a communication speed as compared with a case of passing the signal through a partial loop-shaped wire.

For the same semiconductor memory chip 20M, by positioning the second wire W2 or the third wire W3 having a partial loop shape between adjacent first wires W1, the interval between the adjacent first wires W1 can be widened, and thus, it is possible to solve issues related to bonding capillary or the like interfering with other wires when bonding the first wires W1 to the electrodes 20T.

For example, when an interval between adjacent wires is narrow, the risk increases in that a bonding capillary or the like will hit or otherwise interfere with the other already bonded wires during bonding of the wires. In some instances, a height of a wire has to be reduced to avoid interference. For example, when an interval between adjacent wires is 70 µm, heights of the wires typically have to be 200 µm or less. However, in the semiconductor device 10 according to the present embodiment, the second wire W2 and the fourth wire W4 are connected between adjacent first wires W1 on the same semiconductor memory chip 20M, and thereby, the interval between the adjacent first wires W1 can be relatively wide (for example, 100 µm or more). Therefore, it is possible to avoid problems with a bonding capillary or the like interfering with placement of other wires. As a result, it is possible to provide the semiconductor device 10 in which heights of the first wires W1 are increased and the number of stacked semiconductor memory chips 20M can be increased.

Likewise, the VSS terminal 20TS to which the fourth wire W4 is connected may be provided between the two I/O terminals 20TI. The second wire W2 may be further connected between VSS terminals 20TS of adjacently stacked semiconductor memory chips 20M. With this configuration, a ground potential can be supplied to the support 40 via the third wire W3, and it is possible to supply the ground potential to the VSS terminal 20TS of each semiconductor memory chip 20M via a plurality of the second wires W2 connected between the fourth wire W4 connected to the support 40 and the respective semiconductor memory chips 20M. Since the support 40 provides a capacitance in the vicinity of the semiconductor memory chip 20M, even when a high frequency signal is transmitted and received via the I/O terminal 20TI, it is possible to reduce influence of noise that can be generated at the VSS terminal 20TS due to this.

In addition, the first electrode layer 42 and the second electrode layer 44 of the support 40 also function as shields. Particularly, when a region where the semiconductor chip 20 is provided and a region where the first electrode layer 42 and the second electrode layer 44 are formed at least partially overlapping with each other from a top view, it is possible to suitably block electromagnetic waves generated from a semiconductor chip 20 from leaking below the support 40. Further, it is possible to suitably shield the semiconductor device 10 from an electromagnetic wave generated from other devices and the like. For example, when the semiconductor device 10 can be mounted on a printed wiring board (also referred to as a printed circuit board), the semiconductor device 10 can be suitably shielded from an electromagnetic wave generated from wiring and the like due to a high frequency signal traveling thereon.

Figure 3H:
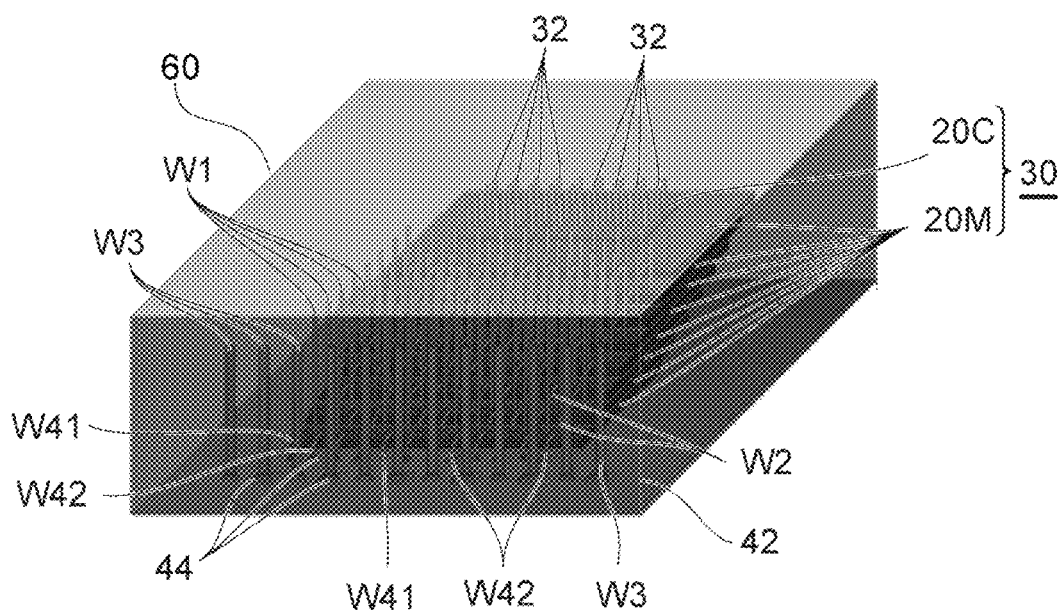
Figure 3I:
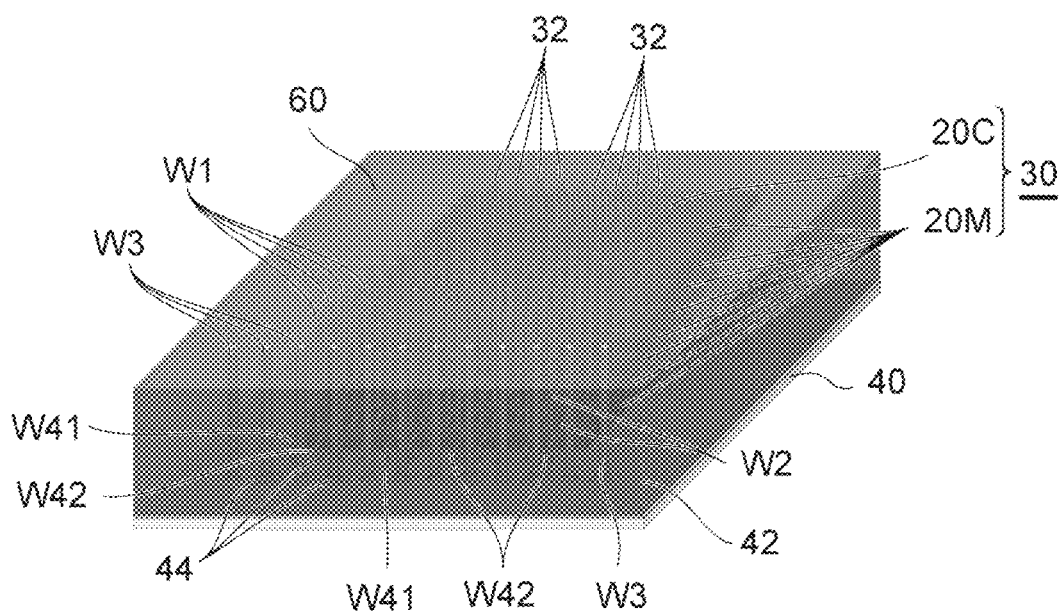

The semiconductor device 10 may include a sealing resin 60 (FIG. 3I). The sealing resin 60 is provided on the support 40 to cover the first wires W1, the second wires W2, the third wires W3, the fourth wires W4, the stacked body 30, and the copper pillar terminals 32. However, upper ends of the first wire W1, the third wire W3, and the copper pillar terminal 32 can be exposed from the sealing resin 60 to be connected to the redistribution layer 50.

The upper ends of the first wires W1, the third wires W3, and the copper pillar terminals 32 may be connected to the redistribution layer 50. In the semiconductor device 10 according to the present embodiment, the redistribution layer 50 is provided at a position separated away from the stacked body 30 in the upward direction. For example, the redistribution layer 50 can be at a position several hundred microns away from the uppermost surface of the stacked body 30. The distance between the redistribution layer 50 and the stacked body 30 corresponds to a height of a copper pillar terminal 32 on an uppermost surface of the stacked body 30. The redistribution layer 50 electrically connects the bump electrodes 70 provided on the redistribution layer 50 to the first wires W1, the third wires W3, and the copper pillar terminals 32, respectively. The redistribution layer 50 includes, for example, a plurality of stacked insulating layers, wires formed in the respective insulating layers, and vias connecting the wires of different layers. The insulating layer is formed of, for example, a polymer material, and the wires and vias are formed of, for example, copper. The redistribution layer 50 functions as a substrate that supports the sealing resin 60 and the stacked body 30 coated with the sealing resin 60 when the bump electrodes 70 are mounted on a printed wiring board or the like. The redistribution layer 50 can be referred to as a wiring substrate in some instances. Since the redistribution layer 50 according to the present embodiment is formed to be larger in a planar area than the stacked body 30 from a top view, the semiconductor device 10 can have a fan-out type wafer level chip size package (WLCSP) structure.

A plurality of the bump electrodes 70 (FIG. 3J) are formed on the redistribution layer 50. The bump electrodes 70 are, for example, a ball grid array (BGA) in which a plurality of ball-shaped bump electrodes 70 are arranged in a two-dimensional array.

The semiconductor device 10 having the above configuration can be mounted on a printed wiring board of an external device such as a host device, and thus, it is possible to read information from the semiconductor memory chip 20M and to record information received from the external device in the semiconductor memory chip 20M, according to a command received from the external device via the BGA.

Manufacturing Method of Semiconductor Device

A manufacturing method of a semiconductor device 10 will be described. First, the support 40 is provided as illustrated in FIG. 3A. The first electrode layer 42 and the second electrode layer 44 of the support 40 may be formed on the entire surface of the support 40. In any event, at least part of the first electrode layer 42 and the second electrode layer 44 of the support 40 may be covered with a resin or the like.

Next, as illustrated in FIG. 3B, a plurality of openings OP are formed in the first electrode layer 42 of the support 40. Since portions of the first electrode layer 42 and the insulating layer 46 are removed in the formation of the openings OP, the second electrode layer 44 is exposed at the bottom of the openings OP.

Subsequently, as illustrated in FIG. 3C, a plurality of semiconductor memory chips 20M are stacked. As described above, the semiconductor memory chip 20M is offset in a predetermined direction with respect to the semiconductor memory chip 20M immediately below when stacked thereon. Therefore, the electrodes 20T formed at an end portion of the semiconductor memory chip 20M are not covered by the semiconductor memory chip 20M of another, upper layer, and can be visually recognized when viewed from a direction perpendicular to a surface of the semiconductor memory chip 20M. Each semiconductor memory chip 20M is adhered to the semiconductor memory chip 20M of a lower layer or the support 40 by a die attach film 22 or the like.

Then, as illustrated in FIG. 3D, the controller chip 20C is stacked on the uppermost semiconductor memory chip 20M to provide the completed stacked body 30. The copper pillar terminals 32 protrude upward and can be provided in advance on a plurality of electrodes on the controller chip 20C. The copper pillar terminals 32 can be formed, for example, by a plating process. However, in some instances, instead of copper pillar terminals 32, wires or other conductor structures may protrude upward from the electrodes of the uppermost semiconductor chip 20 of the stacked body 30. The controller chip 20C is adhered to the uppermost semiconductor memory chip 20M by a die attach film 22. Here, when the number of stacked semiconductor memory chips 20M is varied, the final height of the stacked body 30 may vary somewhat from expected due to the dimensional tolerances of the semiconductor memory chips 20M and the die attach films 22. Therefore, a step of determining lengths of a wire, a copper pillar terminal, or other conductors to be connected to the uppermost semiconductor chip 20 may need to be performed based on the actual final height of the stacked body 30. When this step is to be performed, the step of providing a conductor of the determined length on the electrode of the uppermost semiconductor chip 20 is necessarily performed thereafter.

Subsequently, as illustrated in FIG. 3E, the second wires W2 and the fourth wires W4 are bonded by a wire bonder. By this step, the VCCQ terminals of the respective semiconductor memory chips 20M are electrically connected to the first electrode layer 42 of the support 40. Further, the VSS terminals 20TS of the respective semiconductor memory chips 20M are electrically connected to the second electrode layer 44 of the support 40.

Thereafter, as illustrated in FIG. 3F, the first wires W1 are bonded to electrodes 20T (for example, I/O terminals and control terminals) of the semiconductor memory chips 20M by a wire bonder or the like. The first wires W1 can be connected to the electrodes 20T of the semiconductor memory chips 20M by diffusing a metal (for example, gold) forming the first wires W1 by applying ultrasonic waves or heat by using a wire bonder or the like. The first wires W1 are formed to extend upward to a height corresponding to the upper ends of the copper pillar terminals 32, and then cut by using a known technique such as a pull cut method.

The first wires W1 have lower ends connected to electrodes 20T of the semiconductor memory chips 20M, but the upper ends thereof are free (unconnected) ends at this point. The upper ends of the first wires W1 are at a height substantially equal to the upper ends of the copper pillar terminals 32.

Since the second wires W2 and the fourth wires W4 are provided in a loop shape, the second wires W2 and the fourth wires W4 do not hinder bonding of the first wires W1. Further, as described above, since the same semiconductor memory chip 20M is configured to bond the second wire W2 or the fourth wire W4 between at least a part of the adjacent first wires W1, an interval between the adjacent first wires W1 can be increased, and thus, it is possible to solve the problem related to a bonding capillary or the like interfering with surrounding first wires W1 during the bonding of a first wire W1. As a result, heights of the first wired W1 can be increased, and the number of stacked semiconductor memory chips 20M can be increased.

Then, as illustrated in FIG. 3G, a plurality of third wires W3 are bonded to the first electrode layer 42 and the second electrode layer 44 of the support 40 by a wire bonder as in a manner similar to the first wires W1. The third wires W3 extend upward to a height corresponding to upper ends of the copper pillar terminals 32 and are then cut.

The third wires W3 at this point thus have lower ends connected to the support 40, but upper ends thereof are free ends. The upper ends of the third wires W3 are a height substantially equal to the height of the upper ends of the copper pillar terminals 32 and upper ends of the first wires W1. As illustrated in the figures, diameters of the third wires W3 are preferably greater than diameters of the first wires W1. By increasing the diameters of the third wires W3, a more stable power (or ground potential) can be supplied to the support 40. However, in other instances, the diameters of the third wires W3 may be equal to the diameters of the first wires W1.

Thereafter, as illustrated in FIG. 3H, the sealing resin 60 is provided on the support 40 to cover the first wires W1, the second wires W2, the third wires W3, the fourth wires W4, and the stacked body 30. The sealing resin 60 is a mold resin containing a filler such as alumina, silica, aluminum hydroxide, and aluminum nitride.

Subsequently, as illustrated in FIG. 3I, the sealing resin 60 is ground by a grindstone or the like to remove a portion of the sealing resin 60 and expose the upper ends of the first wires W1, the third wires W3, and the copper pillar terminals 32.

Figure 3J:
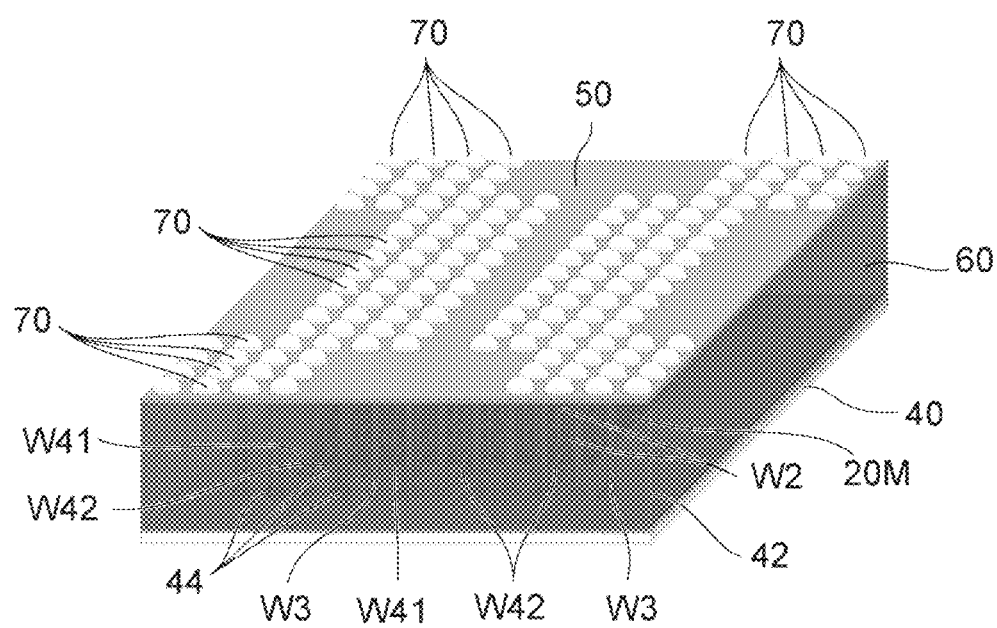

Thereafter, as illustrated in FIG. 3J, the redistribution layer 50 and the bump electrodes 70 provided on the redistribution layer 50 are placed on the sealing resin 60. The redistribution layer 50 may be referred to as a substrate, a circuit substrate, a printed circuit board, or the like. The redistribution layer 50 electrically connects the upper ends of the first wires W1, the third wires W3, and the copper pillar terminals 32 to the bump electrodes 70 of a BGA or the like. Wires and vias of the redistribution layer 50 are formed by, for example, copper plating.

According to the semiconductor device 10 described above, each of the first wires W1 are connected to a semiconductor chip 20 and extend to at least a height equal to the upper surface of the stacked body 30. The second wires W2 connect two semiconductor chips 20 to each other. By this arrangement, problems related to a connection device interfering with other wires when bonding the first wires W1 are avoided as compared with a case where wires extending vertically are provided for all electrodes. However, by connecting upper ends of the first wires W1 to the redistribution layer 50, a communication speed can be increased.

In some examples, instead of forming a redistribution layer 50, a flip-chip structure may be adopted in which the upper ends of the first wires W1 and the like in the state of FIG. 3I are pressed against electrodes such as bump electrodes formed on a wiring board. Alternatively, bump electrodes may be formed at the upper ends of the first wires W1, the third wires W3, and the copper pillar terminals 32, and then these bump electrodes may be connected to electrodes formed on a wiring board.

In some examples, the support 40 may supply another potential or signal. For example, the first electrode layer 42 may supply a VCC power, and the second electrode layer 44 may supply a VCCQ power. Further, the support 40 may have a structure of three or more layers. When formed as a three-layer structure, the support 40 may include a second insulating layer and a third electrode layer in addition to the first electrode layer 42, the insulating layer 46, and the second electrode layer 44. Powers having different potentials may be supplied to each electrode layer.

The stacked body 30 does not have to include the controller chip 20C. In such a case, electrodes such as a BGA may be provided on a controller chip, and the electrodes such as the BGA, the first wires W1, or the like can be connected by a redistribution layer. Further, the controller chip may be provided outside the semiconductor device 10.

Further, a manufacturing method of the semiconductor device 10 described above includes a step of stacking a plurality of semiconductor chips 20 to provide the stacked body 30, a step of connecting two semiconductor chips 20 to each other by using the second wires W2, and a step of connecting the first wires W1 to one semiconductor chip 20 and extending the first wires W1 to at least a height of an upper end of the stacked body 30.

According to the manufacturing method of the above semiconductor device 10, it is generally preferable to connect the first wires W1 to a semiconductor chip 20 after two semiconductor chips 20 have already been connected to each other with the second wires W2.

The semiconductor device 10 may be manufactured by applying an RDL first method by which the redistribution layer 50 is formed in advance and arranged on the sealing resin 60.

Second Embodiment

Hereinafter, a semiconductor device 10A according to a second embodiment will be described. Parts different from the first embodiment will be mainly described, and the same or substantially similar parts are given the same reference numerals as in the first embodiment, and further description thereof may be omitted or simplified.

The semiconductor device 10A according to the second embodiment does not include a support 40, third wires W3, and fourth wires W4. That is, the semiconductor device 10A includes a stacked body 30 including a plurality of stacked semiconductor chips 20, first wires W1 that are connected to a semiconductor chip 20 and extend to at least a height of an upper end of the stacked body 30, and second wires W2 that connect two of the semiconductor chips 20 to each other.

With this configuration, an interval between at least some adjacent first wires W1 can be widened by using the first wires W1 and the second wires W2 together.

For example, as illustrated in FIG. 4, a plurality of semiconductor chips 20 are stacked on a support 40A to form a stacked body 30, adjacent semiconductor chips 20 are connected to each other by second wires W2 (not illustrated), each of the first wires W1 are connected to a semiconductor chip 20 and extend to at least a height of an upper end of the stacked body 30. After this stacking and formation of wires, the support 40A is removed by grinding or the like, and thereby, the semiconductor device 10A can be manufactured. The figure schematically illustrates a side surface of the semiconductor device 10A at a time point before the support 40A is removed.

In the semiconductor device 10A, two adjacent first wires W1 connected to the same semiconductor chip 20 may be respectively connected to two terminals 20T (for example, I/O terminal 20TI) provided on the semiconductor chip 20. Further, at least one of the second wires W2 may be connected to another terminal 20T (for example, the VCCQ terminal 20TC or the VSS terminal 20TS) provided between the other two terminals 20T to which the first wires W1 are connected. The other terminals 20T may by second wires W2 to another semiconductor chip 20 to be connected to a redistribution layer 50 via first wires W1 connected to the terminals 20T of this other semiconductor chip 20 (for example, the uppermost layer chip). With such a configuration, an interval between the first wires W1 can be widened.

Further, the first wires W1 may be further connected to the electrodes 20T to which the second wires W2 or the fourth wires W4 having a loop shape are connected.

Third Embodiment

Figure 5A:
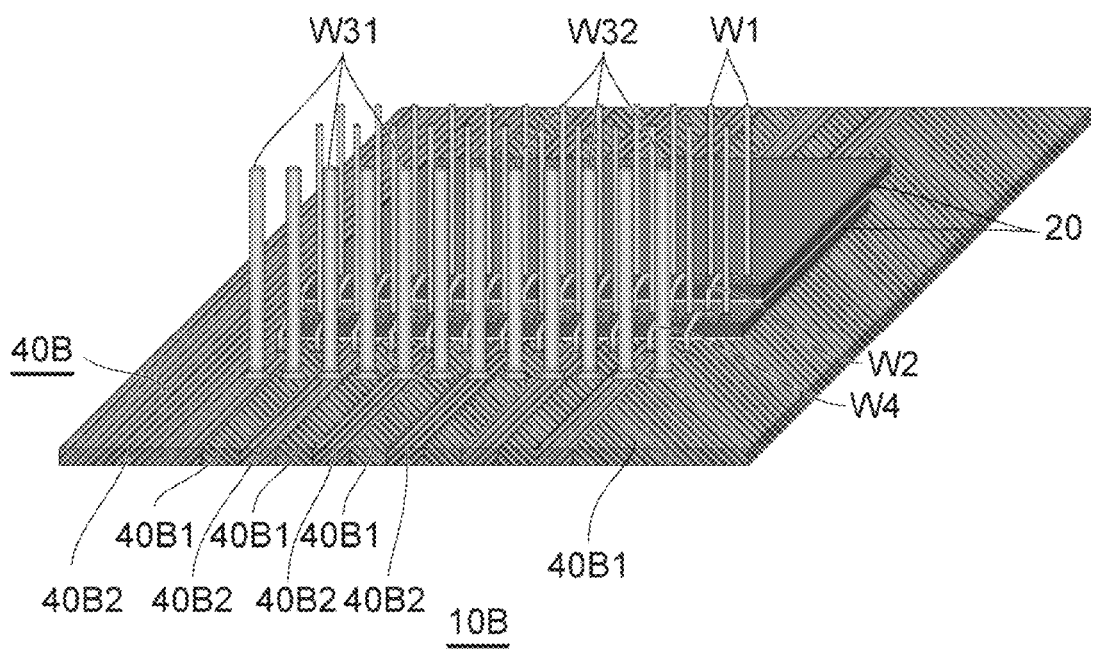
FIG. 5A is a perspective view schematically illustrating a semiconductor device according to a third embodiment.

Hereinafter, a semiconductor device 10B according to a third embodiment will be described. In the semiconductor device 10B according to the third embodiment, a configuration of the support 40B is different from the configuration of the support 40 according to the first embodiment. FIG. 5A is a perspective view of the semiconductor device 10B. As illustrated in FIG. 5A, the support 40B of the semiconductor device 10B has a configuration in which a region 40B1 for supplying a constant potential (for example, a potential corresponding to VCCQ) and a region 40B2 for supplying another constant potential (for example, a ground potential) are alternately formed. The region 40B1 and the region 40B2 are insulated by an insulating layer. For example, third wires W31 are connected to the region 40B1, and third wires W32 is connected to the region 40B2. According to the semiconductor device 10B, it is possible to provide a region for supplying different potentials to the support 40B without providing a layer structure such as in the support 40.

Figure 5B:
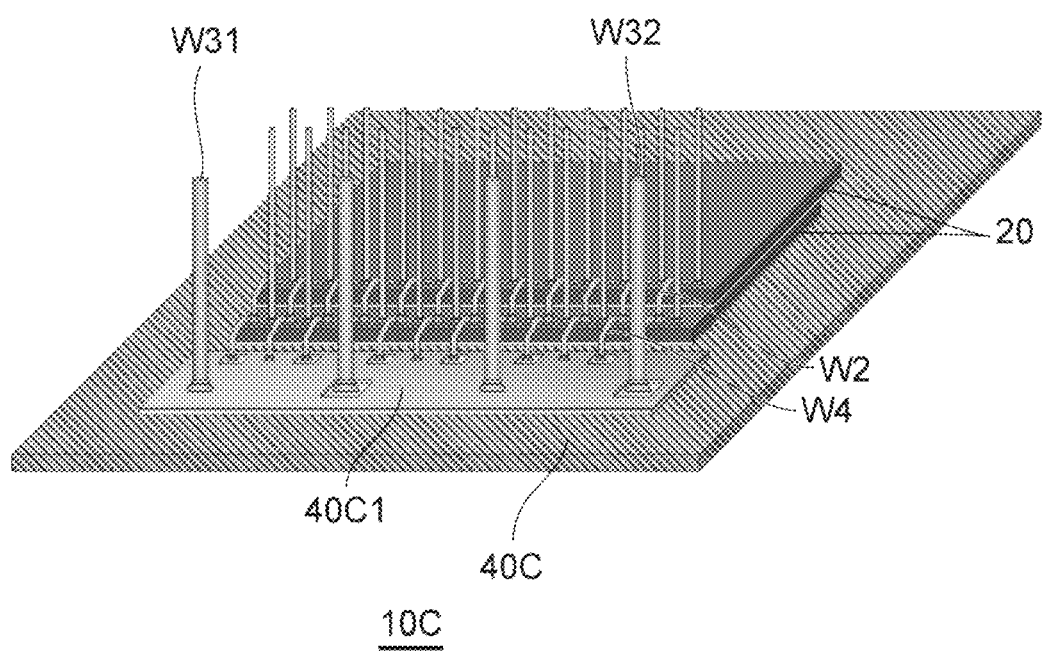
FIG. 5B is another perspective view schematically illustrating a semiconductor device according to a third embodiment.
Figure 5C:
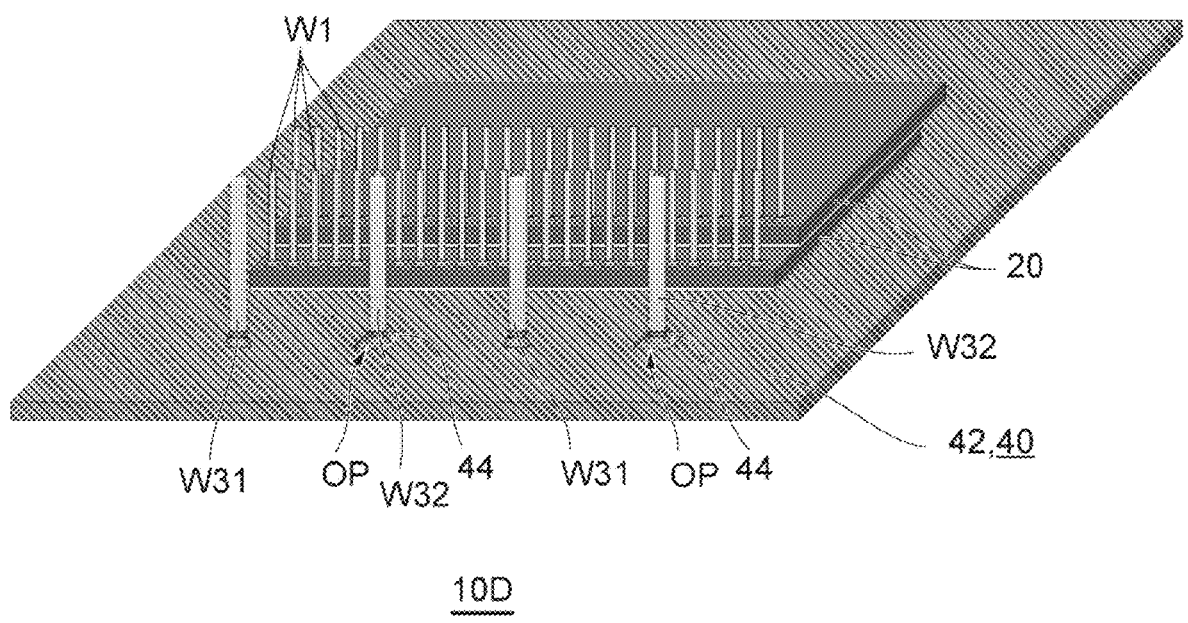
FIG. 5C is a perspective view schematically illustrating a semiconductor device according to a fourth embodiment.

FIG. 5B illustrates a semiconductor device 10C in which a capacitor 40C1 is provided on a support 40C, as a modification example of the semiconductor device 10B. As illustrated in FIG. 5B, the semiconductor device 10C includes the capacitor 40C1 having two electrode layers and an insulating layer sandwiched therebetween formed on the support 40C. It is possible with this configuration to provide different potentials to each of the semiconductor chip 20 by using wires formed in a partial loop shape without providing a layer structure such as the support 40. The support 40C may be removed partially or wholly after sealing with a resin.

Fourth Embodiment

Hereinafter, a semiconductor device 10D according to a fourth embodiment will be described. The semiconductor device 10D according to the fourth embodiment is different from the semiconductor devices according to the other embodiments in that the semiconductor device 10D does not include any wires formed in a partial loop shape. Specifically, the semiconductor device 10D includes a stacked body that includes a plurality of stacked semiconductor chips 20, a support 40 that supports the stacked body, first wires W1 that are connected to one semiconductor chip 20 and extend to at least a height of an upper end of the stacked body, and third wires W3 that are connected to the support 40 and extend to at least the height of the upper end of the stacked body. The first wires W1 are connected to respective electrodes 20T including VCCQ terminals 20TC, VSS terminals 20TS, and I/O terminals 20TI. The support 40 may include the first electrode layer 42 and the second electrode layer 44, in a manner similar to that illustrated in FIG. 2A. The third wires W3 may include third wires W31 connected to the first electrode layer 42 and third wires W32 connected to the second electrode layer 44.

The semiconductor device 10D having the above configuration also enables the support 40 to function as an electromagnetic shield. Furthermore, since the support 40 forms a capacitor, even when a high frequency signal is transmitted and received via an I/O terminal 20TI, it is possible to reduce influence of noise that can occur on the VSS terminals 20TS or the like due to this.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a support;
   a stacked body on the support and including a plurality of semiconductor chips stacked on each other, the stacked body having a lower surface facing the support and an upper surface facing away from the support;
   a first wire that is connected to one of the semiconductor chips and extends upward from the semiconductor chip to at least the height of the upper surface of the stacked body; and
   a second wire that is connected to the support and extends upward from the support to at least the height of the upper surface of the stacked body.

2. The semiconductor device according to claim 1, further comprising:
   a third wire that connects two of the semiconductor chips to each other; and
   a fourth wire that connects the support to one of the semiconductor chips.

3. The semiconductor device according to claim 2, further comprising:
   a wiring substrate above the stacked body, wherein
   the first wire connects the wiring substrate to the one of the semiconductor chips, and
   the second wire connects the wiring substrate to the support.

4. The semiconductor device according to claim 3, further comprising:
   a plurality of second wires that are each connected to the support and extend upward from the support to at least the height of the upper surface of the stacked body, wherein
   the support includes a first electrode layer, a second electrode layer, and a dielectric layer between the first electrode layer and the second electrode layer, and
   one second wire of the plurality of second wires connects the wiring substrate to the first electrode layer, and
   another second wire of the plurality of second wires connects the wiring substrate to the second electrode layer.

5. The semiconductor device according to claim 4, wherein the first electrode layer is a power supply layer.

6. The semiconductor device according to claim 4, further comprising:
   an opening formed in the first electrode layer, the second electrode layer being exposed by the opening, wherein
   the second wire that connects the wiring substrate to the second electrode layer passes through the opening.

7. The semiconductor device according to claim 4, further comprising:
   a plurality of first wires that are each connected to one of the semiconductor chips and extend upward from the semiconductor chip to at least the height of the upper surface of the stacked body; and
   a plurality of fourth wires that each connect the support to one of the semiconductor chips, wherein
   one first wire of the plurality of first wires connects the wiring substrate to a first electrode of the semiconductor chip,
   another first wire of the plurality of first wires connects the wiring substrate to a second electrode of the semiconductor chip, and
   one fourth wire connects the first electrode to a third electrode that is between the first electrode and the second electrode in a direction parallel to a surface of the semiconductor chip.

8. The semiconductor device according to claim 1, wherein a diameter of the second wire is greater than a diameter of the first wire.

9. The semiconductor device according to claim 1, wherein
the first wire is wire bonded to the one of the semiconductor chips, and
the second wire is wire bonded to the support.

10. A semiconductor device, comprising:
a support including a first electrode layer, a second electrode layer, and a dielectric layer between the first and second electrode layers in a first direction, the support including a plurality of openings therein exposing the second electrode layer;
a stacked body on the support and including a plurality of semiconductor chips stacked on each other, the stacked body having a lower surface facing the support and an upper surface facing away from the support;
a plurality of first wires connected to one of the semiconductor chips and extending upward from the semiconductor chip to at least the height of the upper surface of the stacked body;
a plurality of second wires connected to the support and extending upward from the support to at least the height of the upper surface of the stacked body;
a plurality of third wires connected from one semiconductor chip in the stacked body to another semiconductor chip in the stack; and
a sealing resin on the support covering the stacked body, the first wires, the second wires, and the third wires, upper ends of the first wires and the second wires being exposed at an uppermost surface of the sealing resin.

11. The semiconductor device according to claim 10, wherein each third wire is connected to a semiconductor chip at a position between two otherwise adjacent first wires connected to the semiconductor chip.

12. The semiconductor device according to claim 10, further comprising:
a wiring substrate above the stacked body on the uppermost surface of the sealing resin, the wiring substrate being connected to the first wires and the second wires.

13. The semiconductor device according to claim 10, further comprising:
a plurality of pillar terminals disposed on an upper surface of an uppermost one of the semiconductor chips in the stacked body, the plurality of pillar terminals being covered by the sealing resin with upper ends exposed at the uppermost surface of the sealing resin.

14. The semiconductor device according to claim 10, further comprising:
a plurality of fourth wires connecting one of the semiconductor chips in the stacked body to one of the first or second electrode layers of the support,
wherein the fourth wires connected to the second electrode layer pass through an opening in the plurality of openings.

15. The semiconductor device according to claim 10, wherein a diameter of the second wires is greater than a diameter of the first wires.

16. The semiconductor device according to claim 10, wherein
the first wires are wire bonded to the one of the semiconductor chips,
the second wires are wire bonded to the support, and
the third wires are bonded at each end to the semiconductor chips.

17. A semiconductor device, comprising:
a support including a first electrode layer, a second electrode layer, and a dielectric layer between the first and second electrode layers in a first direction, the support including a plurality of openings therein exposing the second electrode layer on a first side;
a stacked body on the first side of the support and including a plurality of semiconductor chips stacked on each other in an offset manner such that electrode terminals on one edge portion of each semiconductor chip are left exposed, the stacked body having a lower surface facing the support and an upper surface facing away from the support;
a plurality of first wires bonded at one end to electrode terminals of the semiconductor chips and extending upward from the semiconductor chip such that the other end of each first wire is at a height at least equal to the height of the upper surface of the stacked body;
a plurality of second wires bonded at one end to one of the first or second electrode layers of the support and extending upward from the support such that the other end of each second wire is at a height at least equal to the height of the upper surface of the stacked body;
a plurality of third wires bonded on one end to an electrode terminal of one semiconductor chip in the stacked body and bonded on another end to an electrode terminal of another semiconductor chip in the stack; and
a sealing resin on the support covering the stacked body, the first wires, the second wires, and the third wires, upper ends of the first wires and the second wires being exposed at an uppermost surface of the sealing resin.

18. The semiconductor device according to claim 17, wherein each third wire is connected to an electrode terminal at a position between two otherwise adjacent electrode terminals to which first wires are bonded.

19. The semiconductor device according to claim 17, further comprising:
a wiring substrate above the stacked body on the uppermost surface of the sealing resin, the wiring substrate being connected to the upper ends of the first wires and the second wires.

20. The semiconductor device according to claim 17, further comprising:
a plurality of fourth wires bonded on one end to an electrode terminal of a semiconductor chip in the stacked body and bonded on the other end to the first or second electrode layer of the support.

* * * * *